(12) United States Patent
Yamamoto et al.

(10) Patent No.: US 7,596,289 B2
(45) Date of Patent: Sep. 29, 2009

(54) OPTICAL/ELECTRICAL HYBRID SUBSTRATE

(75) Inventors: Takanori Yamamoto, Nagano (JP); Kenji Yanagisawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/119,683

(22) Filed: May 13, 2008

(65) Prior Publication Data
US 2008/0285911 A1 Nov. 20, 2008

(30) Foreign Application Priority Data
May 14, 2007 (JP) .............................. 2007-127906

(51) Int. Cl.
*G02B 6/12* (2006.01)
(52) U.S. Cl. .............................. 385/14; 385/88; 385/39
(58) Field of Classification Search .................... 385/14, 385/40, 39, 88–89; 257/734
See application file for complete search history.

(56) References Cited
U.S. PATENT DOCUMENTS

| | | | |
|---|---|---|---|
| 6,285,808 B1* | 9/2001 | Mehlhorn et al. .............. | 385/14 |
| 6,438,281 B1* | 8/2002 | Tsukamoto et al. ........... | 385/14 |
| 6,739,761 B2* | 5/2004 | Tsukamoto et al. ........... | 385/89 |
| 7,340,121 B2* | 3/2008 | Yonekura et al. .............. | 385/14 |
| 2002/0097962 A1* | 7/2002 | Yoshimura et al. ............ | 385/50 |
| 2006/0045418 A1* | 3/2006 | Cho et al. ...................... | 385/31 |
| 2006/0110114 A1* | 5/2006 | Yanagisawa et al. .......... | 385/129 |
| 2006/0133764 A1* | 6/2006 | Okubora et al. ............... | 385/147 |
| 2006/0245681 A1* | 11/2006 | Uchida ......................... | 385/14 |
| 2007/0223935 A1* | 9/2007 | Asai et al. ..................... | 398/164 |
| 2008/0279518 A1* | 11/2008 | Yonekura et al. .............. | 385/127 |

FOREIGN PATENT DOCUMENTS

JP 2003-304953 11/2000

* cited by examiner

*Primary Examiner*—Ellen Kim
(74) *Attorney, Agent, or Firm*—Drinker Biddle & Reath LLP

(57) ABSTRACT

In an optical/electrical hybrid substrate 10 including a wiring board 11 having a wiring and a via, and an optical waveguide 12 including an optical waveguide body 80 having a first clad layer 81, a second clad layer 83 and a core portion 82 disposed between the first clad layer 81 and the second clad layer 83 and provided on the wiring board 11, and a pair of mirrors 88 and 89 for reflecting a light signal, a first wiring pattern 96 for electrically connecting a terminal 117 of a light emitting device 13 for irradiating the light signal to the wiring and via, and a second wiring pattern 97 for electrically connecting a terminal 119 of a light receiving device 14 for receiving the light signal to the wiring and via, the first and second wiring patterns 96 and 97 are disposed in the optical waveguide body 80.

3 Claims, 21 Drawing Sheets

OPTICAL/ELECTRICAL HYBRID SUBSTRATE

BACKGROUND OF THE INVENTION

The present invention relates to an optical/electrical hybrid substrate and more particularly to an optical/electrical hybrid substrate including an optical waveguide provided on a wiring board and serving to transmit a light signal between a light emitting device and a light receiving device.

In recent years, with an increase in a speed of an information communication, a light converted into an electric signal is used as a medium for the information communication. In the light communication field, it is necessary to convert a light signal into an electric signal or to convert the electric signal to the light signal, and to carry out various processings such as a modulation for a light in the light communication. For this reason, there has been developed an optical/electrical hybrid substrate over which the conversion processing is carried out.

FIG. 1 is a sectional view showing a conventional optical/electrical hybrid substrate.

As shown in FIG. 1, a conventional optical/electrical hybrid substrate 200 has a wiring board 201, an optical waveguide 202, vias 204 and 205, wirings 207, 208, 211 and 212, a solder resist 214, a light emitting device 216, and a light receiving device 217.

The wiring board 201 has a substrate body 221, through vias 222 and 223, upper wirings 225 and 226, lower wirings 228 and 229, a solder resist 232, and external connecting terminals 233 and 234.

The through vias 222 and 223 are provided to penetrate through the substrate body 221. The through via 222 has an upper end connected to the upper wiring 225 and a lower end connected electrically to the lower wiring 228. The through via 223 has an upper end connected to the upper wiring 226 and a lower end connected electrically to the lower wiring 229.

The upper wirings 225 and 226 are provided on an upper surface 221A of the substrate body 221. The lower wirings 228 and 229 are provided on a lower surface 221B of the substrate body 221. The solder resist 232 has an opening portion 232A for exposing a part of a lower surface of the lower wiring 228 and an opening portion 232B for exposing apart of a lower surface of the lower wiring 229. The external connecting terminal 233 is provided on the lower wiring 228 in an exposed portion to the opening portion 232A. The external connecting terminal 234 is provided on the lower wiring 229 in an exposed portion to the opening portion 232B.

The optical waveguide 202 is bonded onto the wiring board 201 with an adhesive 250. The optical waveguide 202 has a structure in which a clad layer 236, a core portion 237 and a clad layer 238 are laminated, and has V grooves 241 and 242, through holes 244 and 245, and mirrors 2470 and 2480. The V grooves 241 and 242 are formed on the clad layer 236, the core portion 237 and the clad layer 238. The V groove 241 has an inclined surface 241A in an inclination angle of 45 degrees. The V groove 242 has an inclined surface 242A in an inclination angle of 45 degrees. The through holes 244 and 245 are formed to penetrate through the clad layer 236, the core portion 237 and the clad layer 238. The mirror 2470 is provided on the inclined surface 241A. The mirror 2480 is provided on the inclined surface 242A.

The via 204 is provided on the through hole 244. A lower end of the via 204 is electrically connected to the upper wiring 225. The via 205 is provided on the through hole 245. A lower end of the via 205 is electrically connected to the upper wiring 226.

The wirings 207, 208, 211 and 212 are provided on the clad layer 238. The wiring 207 is electrically connected to the via 204 and the light emitting device 216. The wiring 208 is electrically connected to the light emitting device 216. The wiring 211 is electrically connected to the via 205 and the light receiving device 217. The wiring 212 is electrically connected to the light receiving device 217.

The solder resist 214 is provided to cover an upper surface of the clad layer 238 and a part of each of the wirings 207, 208, 211 and 212. The solder resist 214 has an opening portion 214A for exposing a part of an upper surface of the wiring 207, an opening portion 214B for exposing a part of an upper surface of the wiring 208, an opening portion 214C for exposing a part of an upper surface of the wiring 211, an opening portion 214D for exposing a part of an upper surface of the wiring 212, an opening portion 214E for causing a light signal of the light emitting device 216 to pass therethrough, and an opening portion 214F for causing the light signal to reach the light receiving device 217.

The light emitting device 216 is flip-chip connected to the wirings 207 and 208. The light emitting device 216 has the light emitting portion 247 for irradiating a light signal. The light emitting portion 247 is disposed opposite to the opening portion 214E. The light receiving device 217 is flip-chip connected to the wirings 211 and 212. The light receiving device 217 has the light receiving portion 248 for receiving the light signal. The light receiving portion 248 is disposed opposite to the opening portion 214F (for example, see Patent Document 1).

[Patent Document 1] JP-A-2000-304953

In the conventional optical/electrical hybrid substrate 200, however, the wirings 207, 208, 211 and 212 to be connected to the light emitting device 216 or the light receiving device 217 are provided on the clad layer 238. For this reason, there is a problem in that a size in a vertical direction of the optical/electrical hybrid substrate 200 is increased.

Moreover, the wirings 207, 208, 211 and 212 are provided on the clad layer 238. Therefore, it is necessary to provide the solder resist 214 for protecting the wirings 207, 208, 211 and 212 other than the portions to which the light emitting device 216 and the light receiving device 217 are connected. Consequently, there is a problem in that a cost of the optical/electrical hybrid substrate 200 is increased.

SUMMARY OF THE INVENTION

In consideration of the problems, therefore, it is an object of the invention to provide an optical/electrical hybrid substrate which can reduce a cost and can decrease a size in a vertical direction.

According to a first aspect of the invention, there is provided an optical/electrical hybrid substrate including:

a wiring board having a wiring and a via;

an optical waveguide including an optical waveguide body having a first clad layer, a second clad layer and a core portion disposed between the first clad layer and the second clad layer and provided on the wiring board, and a pair of mirrors for reflecting a light signal;

a first wiring pattern for electrically connecting a terminal of a light emitting device for irradiating the light signal to the wiring and via;

a second wiring pattern for electrically connecting a terminal of a light receiving device for receiving the light signal to the wiring and via, wherein the first and second wiring patterns are disposed in the optical waveguide body.

According to a second aspect of the invention, there is provided the optical/electrical hybrid substrate according to the first aspect, wherein the first wiring pattern has a first pad provided on the second clad layer and connected to the terminal of the light emitting device, a first via provided on the first clad layer, and a first connecting portion for electrically connecting the first pad to the first via, the second wiring pattern has a second pad provided on the second clad layer and connected to the terminal of the light receiving device, a second via provided on the first clad layer, and a second connecting portion for electrically connecting the second pad to the second via, and thicknesses of the first and second connecting portions are set to be almost equal to a thickness of the core portion, and the first and second connecting portions are disposed on the level with a surface on which the core portion is provided.

According to a third aspect of the invention, there is provided the optical/electrical hybrid substrate according to the first aspect, wherein the first wiring pattern has a first pad provided on the second clad layer and connected to the terminal of the light emitting device, a first via provided on the first clad layer, and a first wiring for electrically connecting the first pad to the first via, the second wiring pattern has a second pad provided on the second clad layer and connected to the terminal of the light receiving device, a second via provided on the first clad layer, and a second wiring for electrically connecting the second pad to the second via, and thicknesses of the first and second wirings are set to be almost equal to a thickness of the core portion, and the first and second wirings are disposed on the level with a surface on which the core portion is provided.

According to the invention, the first wiring pattern for electrically connecting the terminal of the light emitting device to the wiring and via provided on the wiring board and the second wiring pattern for electrically connecting the terminal of the light receiving device to the wiring and via provided on the wiring board are disposed in the optical waveguide body. As compared with a conventional optical/electrical hybrid substrate in which the wiring to be connected to the light emitting device or the light receiving device is disposed on the optical waveguide, consequently, it is possible to reduce a size in a vertical direction of the optical/electrical hybrid substrate more greatly.

Moreover, the first and second wiring patterns are disposed in the optical waveguide. Therefore, the second clad layer fulfills the same function as a solder resist provided on a conventional optical/electrical hybrid substrate. Thus, it is not necessary to provide the solder resist on the second clad layer. Consequently, it is possible to reduce a cost of the optical/electrical hybrid substrate.

According to the invention, it is possible to reduce a cost of the optical/electrical hybrid substrate and to decrease a size in a vertical direction of the optical/electrical hybrid substrate.

DETAILED DESCRIPTION OF THE DRAWINGS

Next, an embodiment according to the invention will be described with reference to the drawings.

First Embodiment

Figure 2:
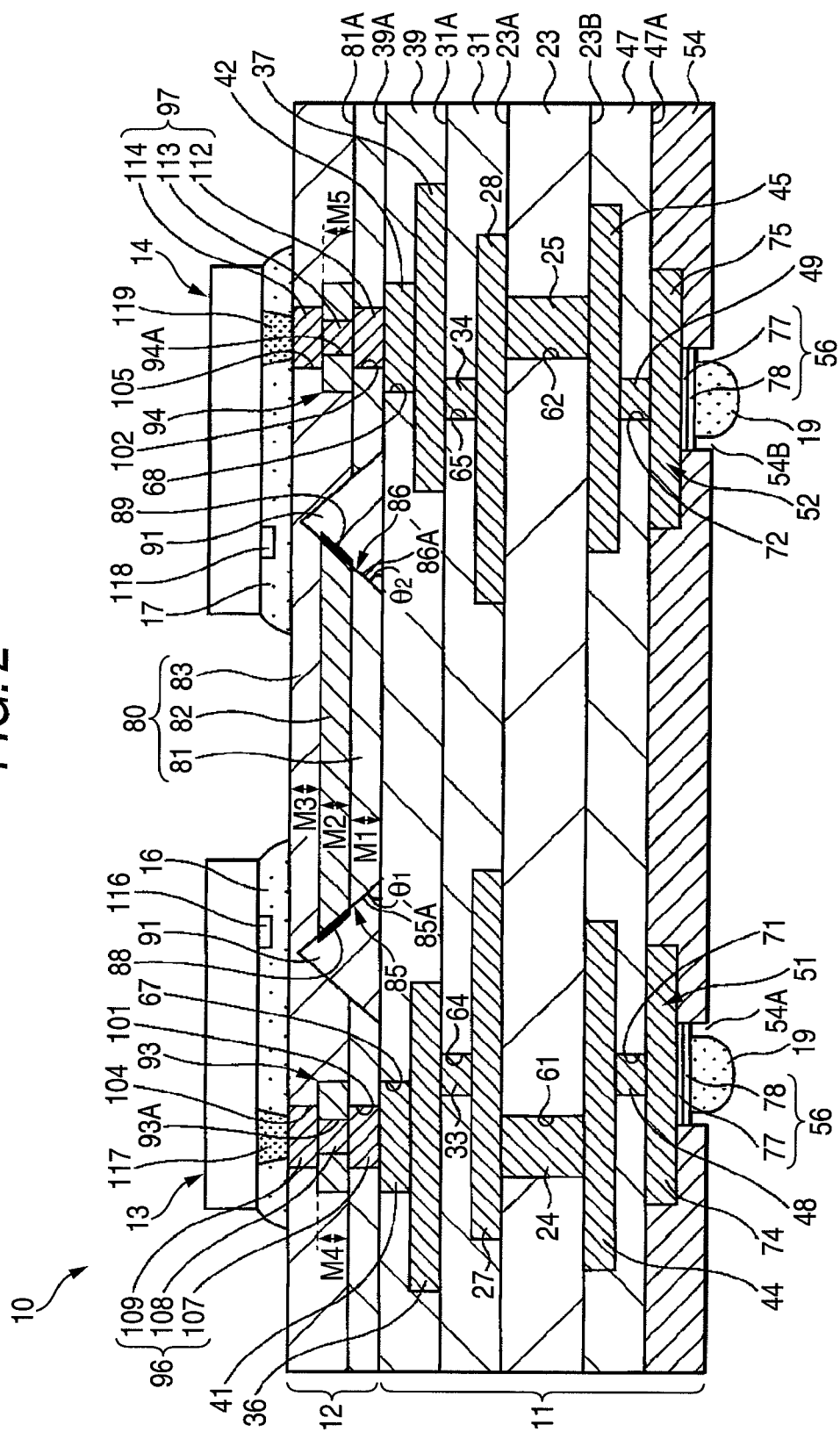
FIG. 2 is a sectional view showing an optical/electrical hybrid substrate according to first embodiment of the invention.

FIG. 2 is a sectional view showing an optical/electrical hybrid substrate according to a first embodiment of the invention.

With reference to FIG. 2, an optical/electrical hybrid substrate 10 according to the first embodiment has a wiring board 11, an optical waveguide 12, a light emitting device 13, a light receiving device 14, underfill resins 16 and 17, and an external connecting terminal 19.

The wiring board 11 has a core board 23, through vias 24 and 25, wirings 27, 28, 36, 37, 44, 45, 51 and 52, insulating layers 31, 39 and 47, vias 33, 34, 48 and 49, vias 41 and 42 for an internal connecting terminal, a solder resist 54, and a diffusion preventing film 56.

The core board 23 is plate-shaped and has through holes 61 and 62. The through via 24 is provided on the through hole 61. The through via 24 has an upper end connected to the wiring 27 and a lower end connected to the wiring 44. The through via 24 serves to electrically connect the wiring 27 to the wiring 44.

The through via 25 is provided in the through hole 62. The through via 25 has an upper end connected to the wiring 28 and a lower end connected to the wiring 45. The through via 25 serves to electrically connect the wiring 28 to the wiring 45.

The wiring 27 is provided on an upper surface 23A of the core board 23 in a corresponding portion to a region in which the through via 24 is formed. The wiring 27 is connected to an upper end of the through via 24. The wiring 28 is provided on the upper surface 23A of the core board 23 in a corresponding portion of a region in which the through via 25 is formed. The wiring 28 is connected to the upper end of the through via 25.

The insulating layer 31 has an opening portion 64 for exposing a part of an upper surface of the wiring 27 and an opening portion 65 for exposing a part of an upper surface of the wiring 28. The insulating layer 31 is provided on the upper surface 23A of the core board 23 in order to cover the wirings 27 and 28.

The via 33 is provided in the opening portion 64. A lower end of the via 33 is connected to the wiring 27. The via 34 is provided in the opening portion 65. A lower end of the via 34 is connected to the wiring 28.

The wiring 36 is provided on an upper surface 31A of the insulating layer 31 in a corresponding portion to a region in which the via 33 is formed. The wiring 36 is connected to an upper end of the via 33. The wiring 37 is provided on the upper surface 31A of the insulating layer 31 in a corresponding portion to a region in which the via 34 is formed. The wiring 37 is connected to an upper end of the via 34.

The insulating layer 39 has an opening portion 67 for exposing a part of an upper surface of the wiring 36 and an opening portion 68 for exposing a part of an upper surface of the wiring 37. The insulating layer 39 is provided on the upper surface 31A of the insulating layer 31 in order to cover the wirings 36 and 37.

The via 41 for an internal connecting terminal is provided in the opening portion 67. A lower end of the via 41 for an internal connecting terminal is connected to the wiring 36. The via 41 for an internal connecting terminal is a via to which a first wiring pattern 96 to be described below is connected. The via 42 for an internal connecting terminal is provided in the opening portion 68. A lower end of the via 42 for an internal connecting terminal is connected to the wiring 37. The via 42 for an internal connecting terminal is a via to which a second wiring pattern 97 to be described below is connected.

The wiring 44 is provided on a lower surface 23B of the core board 23 in a corresponding portion to a region in which the through via 24 is formed. The wiring 44 is connected to a lower end of the through via 24. The wiring 45 is provided on the lower surface 23B of the core substrate 23 in a corresponding portion to a region in which the through via 25 is formed. The wiring 45 is connected to a lower end of the through via 25.

The insulating layer 47 has an opening portion 71 for exposing a part of a lower surface of the wiring 44 and an opening portion 72 for exposing a part of a lower surface of the wiring 45. The insulating layer 47 is provided on the lower surface 23B of the core board 23 in order to cover the wirings 44 and 45.

The via 48 is provided in the opening portion 71. An upper end of the via 48 is connected to the wiring 44. The via 49 is provided in the opening portion 72. An upper end of the via 49 is connected to the wiring 45.

The wiring 51 is provided on a lower surface 47A of the insulating layer 47 in a corresponding portion to a region in which the via 48 is formed. The wiring 51 has a pad portion 74. The wiring 51 is connected to a lower end of the via 48. The wiring 52 is provided on the lower surface 47A of the insulating layer 47 in a corresponding portion to a region in which the via 49 is formed. The wiring 52 has a pad portion 75. The wiring 52 is connected to a lower end of the via 49. For materials of the through vias 24 and 25, the wirings 27, 28, 36, 37, 44, 45, 51 and 52, the vias 33, 34, 48 and 49, and the vias 41 and 42 for an internal connecting terminal, it is possible to use Cu, for example.

The solder resist 54 has an opening portion 54A for exposing a lower surface of the pad portion 74 and an opening portion 54B for exposing a lower surface of the pad portion 75. The solder resist 54 is provided on the lower surface 47A of the insulating layer 47 in order to cover the wirings 44 and 45.

The diffusion preventing film 56 has a structure in which an Ni layer 77 and an Au layer 78 are laminated. The Ni layer 77 is provided in the pad portions 74 and 75 exposed to the opening portions 54A and 54B. The diffusion preventing film 56 serves to prevent Cu contained in the pad portions 74 and 75 from being diffused to the external connecting terminal 19.

The optical waveguide 12 and an upper surface of the insulating layer 39 are bonded to each other through an adhesive sheet (not shown). Moreover, the optical waveguide 12 and upper surfaces of the vias 41 and 42 for an internal connecting terminal are bonded to each other with a conductive adhesive (not shown). The optical waveguide 12 has an optical waveguide body 80, groove portions 85 and 86, mirrors 88 and 89, a clad material 91, connecting portion forming frames 93 and 94, the first wiring pattern 96, and the second wiring pattern 97.

The optical waveguide body 80 has a first clad layer 81, a core portion 82 and a second clad layer 83. The first clad layer 81 is provided on upper surfaces of the insulating layer 39 and the vias 41 and 42 for an internal connecting terminal. The first clad layer 81 has an opening portion 101 for exposing the upper surface of the via 41 for an internal connecting terminal, and an opening portion 102 for exposing the upper surface of the via 42 for an internal connecting terminal. The opening portions 101 and 102 are formed to penetrate through the first clad layer 81. The opening portions 101 and 102 can be set to have a diameter of 500 μm, for example. The first clad layer 81 can be set to have a thickness Ml of 150 μm, for example.

Figure 3:
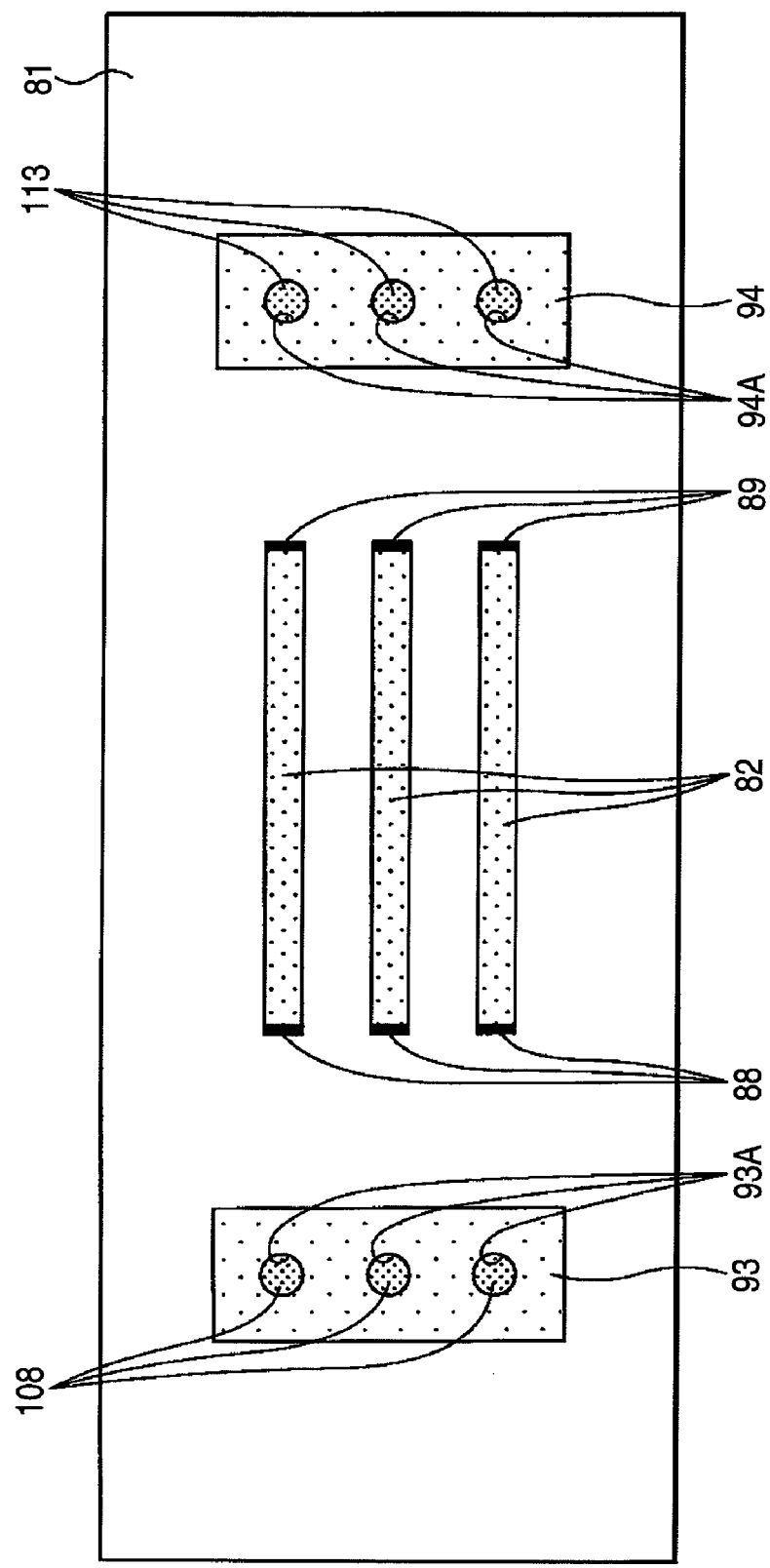
FIG. 3 is a view for explaining a core portion and a connecting portion forming frame illustrated in FIG. 2.
Figure 4:
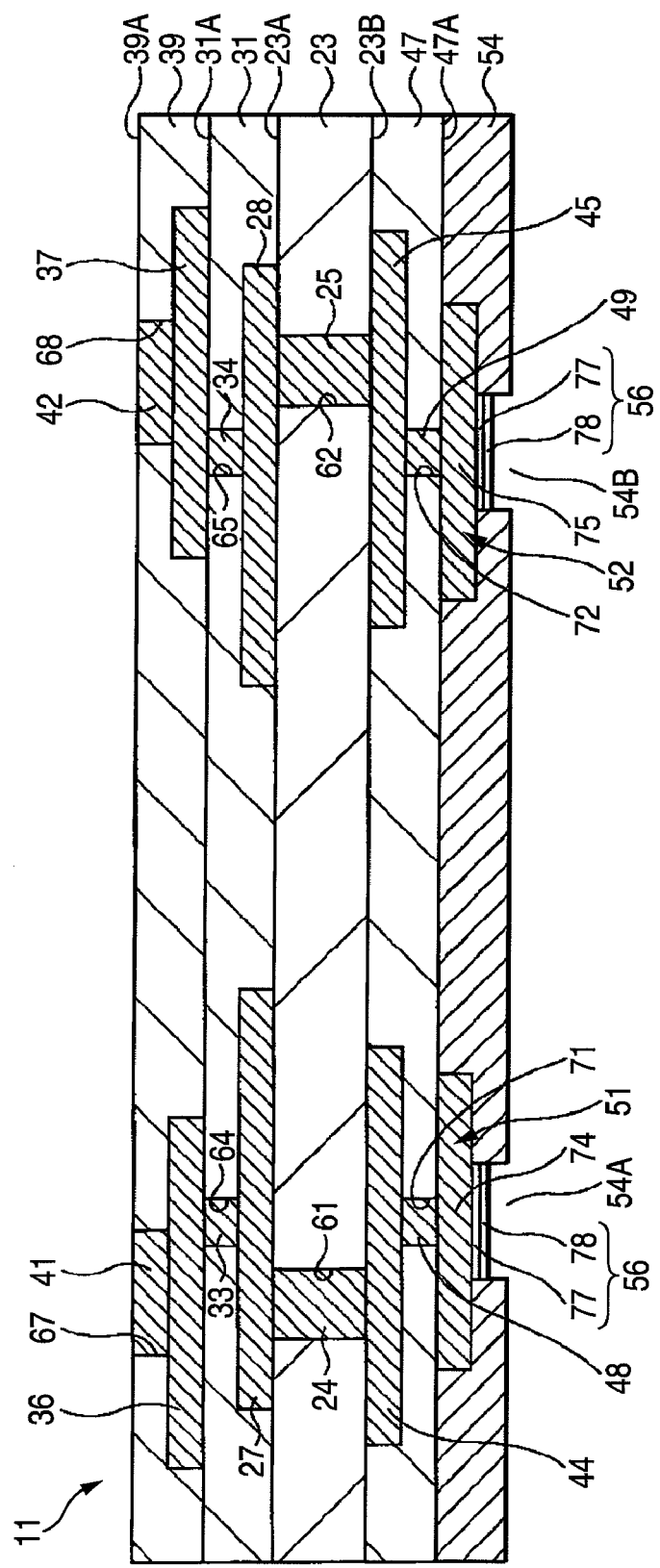
FIG. 4 is a view (No. 1) showing a step of manufacturing an optical/electrical hybrid substrate according to a first embodiment of the invention.
Figure 5:
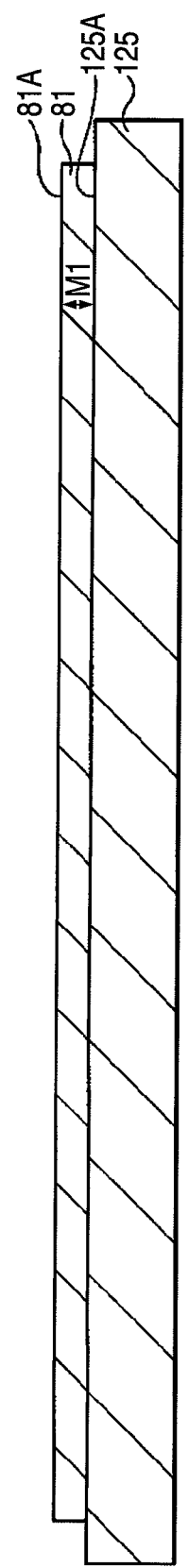
FIG. 5 is a view (No. 2) showing a step of manufacturing an optical/electrical hybrid substrate according to the first embodiment of the invention.

FIG. 3 is a view for explaining the core portion and the connecting portion forming frame illustrated in FIG. 2.

With reference to FIGS. 2 and 3, a plurality of core portions 82 is provided on the first clad layer 81 in a portion disposed between the mirrors 88 and 89. The core portion 82 serves to transmit a light signal. The core portion 82 is constituted by a material having a higher refractive index than the first and second clad layers 81 and 83. The core portion 82 can be set to have a thickness M2 of 80 μm, for example.

The second clad layer 83 is provided on an upper surface 81A of the first clad layer 81 in order to cover the core portion 82 and the connecting portion forming frames 93 and 94. The second clad layer 83 has an opening portion 104 for exposing a part of an upper surface of the connecting portion forming frame 93 and an upper surface of a first connecting portion 108 which will be described below, and an opening portion 105 for exposing a part of an upper surface of the connecting portion forming frame 94 and an upper surface of a second connecting portion 113 which will be described below. The opening portions 104 and 105 can be set to have a diameter of 500 μm, for example. The second clad layer 83 can be set to have a thickness M3 of 150 μm, for example.

The groove portion 85 is formed on the first and second clad layers 81 and 83 in a portion disposed on one of end sides of the core portion 82. The groove portion 85 has an inclined surface 85A on which the mirror 88 is formed. An angle $\theta_1$ formed by the inclined surface 85A and an upper surface 39A of the insulating layer 39 is set to be 45 degrees.

The groove portion 86 is formed on the first and second clad layers 81 and 83 in a portion disposed on the other end side of the core portion 82. The groove portion 86 has an inclined surface 86A on which the mirror 89 is formed. An angle $\theta_2$ formed by the inclined surface 86A and the upper surface 39A of the insulating layer 39 is set to be 45 degrees.

The mirror 88 is provided to cover an end face of the core portion 82 in a corresponding portion to the inclined surface 85A. The mirror 88 serves to reflect a light signal irradiated from the light emitting device 13 toward the core portion 82.

The mirror 89 is provided to cover an end face of the core portion 82 in a corresponding portion to the inclined surface 86A. The mirror 89 serves to reflect the light signal transmitted from the core portion 82 toward the light receiving device 14. For the mirrors 88 and 89, it is possible to use a metal film (more specifically, an Au film), for example. The clad material 91 is provided to fill the groove portions 85 and 86.

The connecting portion forming frame 93 is provided on the first clad layer 81 in a corresponding portion to a position in which the opening portion 101 is formed. The connecting portion forming frame 93 has a plurality of through holes 93A. A diameter of the through hole 93A is set to be smaller than diameters of the opening portions 101 and 104. In the case in which the opening portions 101 and 104 have a diameter of 500 μm, the through hole 93A can be set to have a diameter of 300 μm, for example. The connecting portion forming frame 93 is constituted by a core material to be used for forming the core portion 82. The connecting portion forming frame 93 is constituted to have a thickness M4 which is almost equal to the thickness of the core portion 82.

The connecting portion forming frame 94 is provided on the first clad layer 81 in a corresponding portion to a position in which the opening portion 102 is formed. The connecting portion forming frame 94 has a plurality of through holes 94A. A diameter of the through hole 94A is set to be smaller than diameters of the opening portions 102 and 105. In the case in which the opening portions 102 and 105 have a diameter of 500 μm, the through hole 94A can be set to have a diameter of 300 μm, for example. The connecting portion forming frame 94 is constituted by a core material to be used for forming the core portion 82. Moreover, the connecting portion forming frame 94 is constituted to have a thickness M5 which is almost equal to the thickness of the core portion 82.

Namely, although there is a relation of M2≈M4≈M5, it is not necessarily to satisfy a relation of M1≈M3.

The first wiring pattern 96 serves to electrically connect a terminal 117 of the light emitting device 13 to the via 41 for an internal connecting terminal which is provided in the wiring board 11. The first wiring pattern 96 is provided in the optical waveguide body 80. The first wiring pattern 96 has a first via 107, the first connecting portion 108 and a first pad 109.

The first via 107 is provided in the opening portion 101 formed on the first clad layer 81. A lower end of the first via 107 is electrically connected to the via 41 for an internal connecting terminal. For a material of the first via 107, it is possible to use Cu, for example.

The first connecting portion 108 is provided in the through hole 93A of the connecting portion forming frame 93. The first connecting portion 108 is provided on an upper surface of the first via 107 which is almost on the level with the upper surface 81A of the first clad layer 81. In other words, the first connecting portion 108 is provided on level with a surface in which the core portion 82 is provided. A thickness of the first connecting portion 108 is almost equal to the thickness M2 of the core portion 82. A lower end of the first connecting portion 108 is electrically connected to the first via 107. For a material of the first connecting portion 108, it is possible to use Ag, for example.

Figure 1:
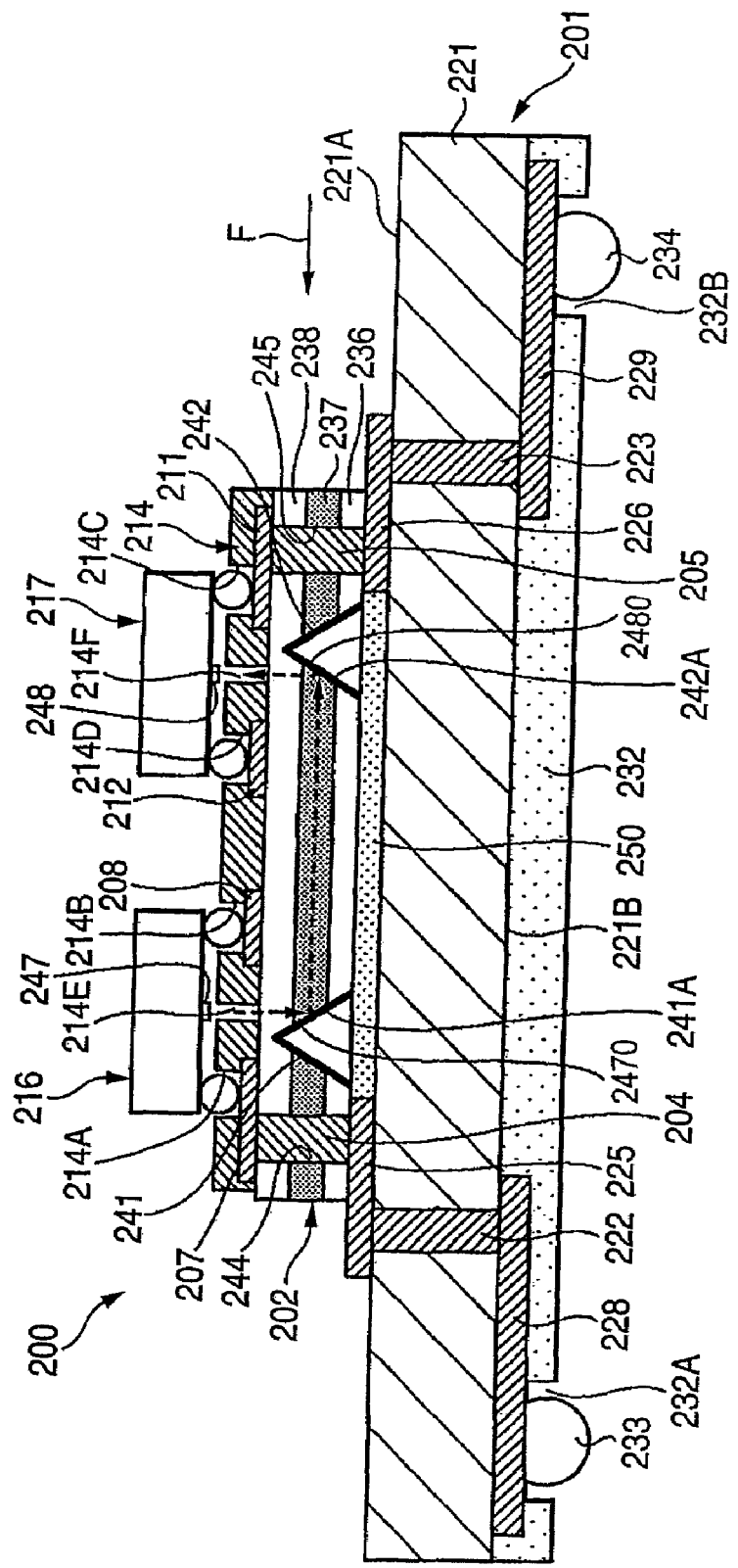
FIG. 1 is a sectional view showing a conventional optical/electrical hybrid substrate.

Thus, the thickness of the first connecting portion 108 is set to be almost equal to the thickness M2 of the core portion 82, and furthermore, the first connecting portion 108 is disposed on the level with the surface on which the core portion 82 is provided. Consequently, the thickness of the optical waveguide body 80 can be prevented from being greater than that of the optical waveguide 202 provided in the conventional optical/electrical hybrid substrate 200 (see FIG. 1).

The first pad 109 is provided in the opening portion 104. The first pad 109 has an upper end connected to the terminal 117 of the light emitting device 13 and a lower end connected to the first connecting portion 108. The first pad 109 is electrically connected to the first via 107 through the first connecting portion 108. For a material of the first pad 109, it is possible to use Cu, for example.

Thus, the first pad 109 to be connected to the terminal 117 of the light emitting device 13 is provided in the opening portion 104 formed on the second clad layer 83. Consequently, the second clad layer 83 fulfills the same function as the solder resist 214 provided in the conventional optical/electrical hybrid substrate 200 (see FIG. 1). Therefore, it is not necessary to provide the solder resist 214 on the second clad layer 83. Thus, it is possible to reduce a cost of the optical/electrical hybrid substrate 10.

The second wiring pattern 97 serves to electrically connect a terminal 119 of the light receiving device 14 to the via 42 for an internal connecting terminal which is provided in the wiring board 11. The second wiring pattern 97 is provided in the optical waveguide body 80. The second wiring pattern 97 has a second via 112, the second connecting portion 113 and a second pad 114.

The second via 112 is provided in the opening portion 102 formed on the first clad layer 81. A lower end of the second via 112 is electrically connected to the via 42 for an internal connecting terminal. For a material of the second via 112, it is possible to use Cu, for example.

The second connecting portion 113 is provided in the through hole 94A of the connecting portion forming frame 94. The second connecting portion 113 is provided on an upper surface of the second via 112 which is almost on the level with the upper surface 81A of the first clad layer 81. In other words, the second connecting portion 113 is provided on the level with a surface on which the core portion 82 is disposed. A thickness of the second connecting portion 113 is almost equal to the thickness M2 of the core portion 82. A lower end of the second connecting portion 113 is electrically connected to the second via 112. For a material of the second connecting portion 113, it is possible to use Ag, for example.

Thus, the thickness of the second connecting portion 113 is set to be almost equal to the thickness M2 of the core portion 82, and furthermore, the second connecting portion 113 is disposed on the level with the surface on which the core portion 82 is provided. Consequently, the thickness of the optical waveguide body 80 can be prevented from being greater than that of the optical waveguide 202 provided in the conventional optical/electrical hybrid substrate 200 (see FIG. 1).

The second pad 114 is provided in the opening portion 105. The second pad 114 has an upper end connected to the terminal 119 of the light receiving device 14 and a lower end connected to the second connecting portion 113. The second pad 114 is electrically connected to the second via 112 through the second connecting portion 113. For a material of the second pad 114, it is possible to use Cu, for example.

Thus, the second pad 114 to be connected to the terminal 119 of the light receiving device 14 is provided in the opening portion 105 formed on the second clad layer 83. Therefore, the second clad layer 83 fulfils the same function as the solder resist 214 (see FIG. 1) provided in the conventional optical/electrical hybrid substrate 200. Consequently, it is not necessary to provide the solder resist 214 on the second clad layer 83. Thus, it is possible to reduce a cost of the optical/electrical hybrid substrate 10.

As described above, the first wiring pattern 96 for electrically connecting the light emitting device 13 to the wiring board 11 and the second wiring pattern 97 for electrically connecting the light receiving device 14 to the wiring board 11 are provided in the optical waveguide body 80. As compared with the conventional optical/electrical hybrid substrate 200 in which the wirings 207, 208, 211 and 212 are formed on the clad layer 238 (see FIG. 1), consequently, it is possible to reduce a size in a vertical direction of the optical/electrical hybrid substrate 10 more greatly.

The light emitting device 13 is provided on the optical waveguide 12 in a corresponding portion to a position in which the first pad 109 and the mirror 88 are formed. The light emitting device 13 has a light emitting portion 116 for irradiating a light signal and the terminal 117. The light emitting portion 116 is disposed above the mirror 88. The terminal 117 is disposed on the first pad 109. The terminal 117 is fixed onto the first pad 109 through a solder (not shown) For the light emitting device 13, it is possible to use a surface emitting laser device (VCSEL), for example.

The light receiving device 14 is provided on the optical waveguide 12 in a corresponding portion to a position in which the second pad 114 and the mirror 89 are formed. The light receiving device 14 has a light receiving portion 118 for receiving the light signal and the terminal 119. The light receiving portion 118 is disposed above the mirror 89. The terminal 119 is disposed on the second pad 114. The terminal 119 is fixed onto the second pad 114 through a solder (not shown) For the light receiving device 14, it is possible to use a photodiode device (PD), for example.

The underfill resin 16 is provided to fill a clearance between the light emitting device 13 and the optical waveguide 12. The underfill resin 16 serves to fix the light emitting device 13 to the optical waveguide 12. For the underfill resin 16, it is possible to use a translucent resin capable of transmitting the light signal.

The underfill resin 17 is provided to fill a clearance between the light receiving device 14 and the optical waveguide 12. The underfill resin 17 serves to fix the light receiving device 14 to the optical waveguide 12. For the underfill resin 17, it is possible to use a translucent resin capable of transmitting the light signal.

The external connecting terminal 19 is provided on a lower surface side of the diffusion preventing film 56. For the external connecting terminal 19, it is possible to use a solder ball, for example.

According to the optical/electrical hybrid substrate in accordance with the embodiment, the first wiring pattern 96 for electrically connecting the terminal 117 of the light emitting device 13 to the wirings and vias provided in the wiring board 11 (more specifically, the through vias 24 and 25, the wirings 27, 28, 36, 37, 44, 45, 51 and 52, the vias 33, 34, 48 and 49, and the vias 41 and 42 for an internal connecting terminal) and the second wiring pattern 97 for electrically connecting the terminal 119 of the light receiving device 14 to the wirings and vias provided in the wiring board 11 are disposed in the optical waveguide body 80. As compared with the conventional optical/electrical hybrid substrate 200 in which the wirings 207, 208, 211 and 212 to be connected to the light emitting device 216 or the light receiving device 217 are disposed on the optical waveguide 202, consequently, it is possible to reduce the size in the vertical direction of the optical/electrical hybrid substrate 10 more greatly.

Moreover, the first pad 109 to be connected to the terminal 117 of the light emitting device 13 is provided in the opening portion 104 formed on the second clad layer 83, and furthermore, the second pad 114 to be connected to the terminal 119 of the light receiving device 14 is provided in the opening portion 105 formed on the second clad layer 83. Consequently, the second clad layer 83 fulfils the same function as the solder resist 214 provided in the conventional optical/electrical hybrid substrate 200 (see FIG. 1). Therefore, it is not necessary to provide the solder resist 214 on the second clad layer 83. Thus, it is possible to reduce the cost of the optical/electrical hybrid substrate 10.

FIGS. 4 to 19 are views showing a process for manufacturing the optical/electrical hybrid substrate according to the first embodiment of the invention. In FIGS. 4 to 19, the same components as those in the optical/electrical hybrid substrate 10 according to the first embodiment have the same reference numerals. Moreover, FIG. 15 shows a state in which a support substrate 125 is removed from a structure shown in FIG. 14 and the structure from which the support substrate 125 is removed is then inverted vertically.

With reference to FIGS. 4 to 19, description will be given to a method of manufacturing the optical/electrical hybrid substrate 10 according to the first embodiment. First of all, at a step shown in FIG. 4, the wiring board 11 is formed by a well-known technique. At a step shown in FIG. 5, then, the first clad layer 81 is formed on an upper surface 125A of the support substrate 125 which is prepared. More specifically, a sheet-like clad layer is stuck to the upper surface 125A of the support substrate 125 and is then cured so that the first clad layer 81 is formed. The thickness M1 of the first clad layer 81 can be set to be 150 μm, for example. For the support substrate 125, it is possible to use a polycarbonate plate, an acrylic plate or a PET plate, for example.

At a step shown in FIG. 6, subsequently, a core material 127 is formed to cover the upper surface 81A of the first clad layer 81. More specifically, the sheet-like core material is stuck to the upper surface 81A of the first clad layer 81. A thickness of the core material 127 can be set to be 80 μm, for example.

Figure 6:
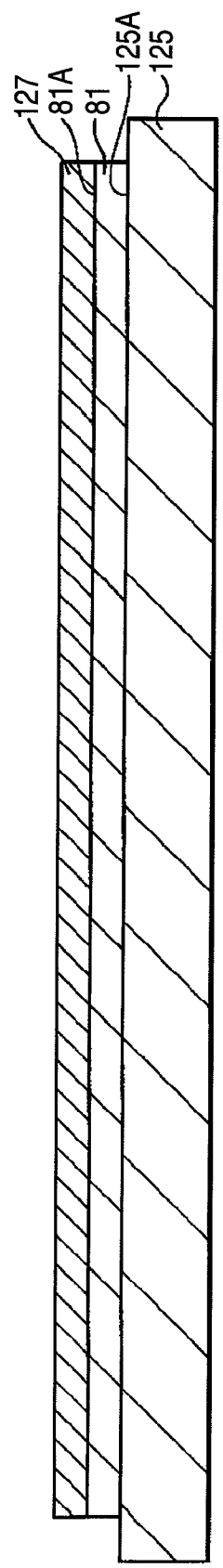
FIG. 6 is a view (No. 3) showing a step of manufacturing an optical/electrical hybrid substrate according to the first embodiment of the invention.
Figure 7:
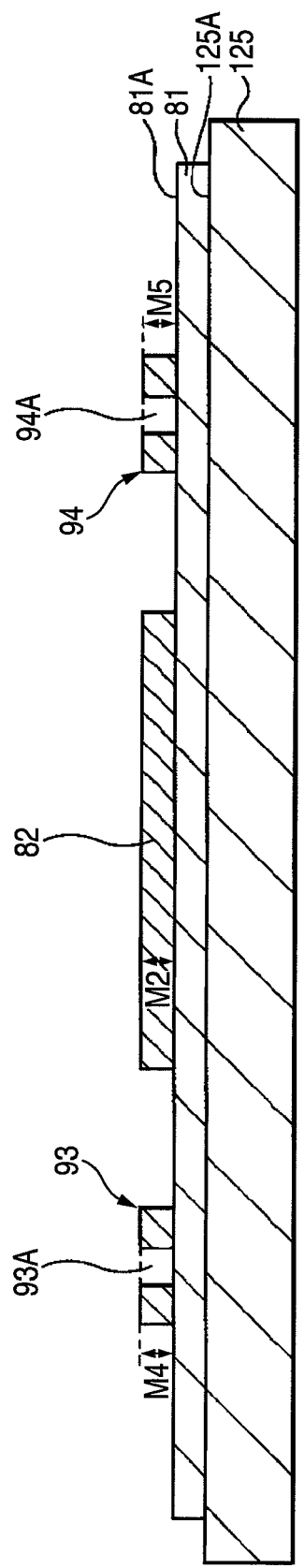
FIG. 7 is a view (No. 4) showing a step of manufacturing an optical/electrical hybrid substrate according to the first embodiment of the invention.

At a step shown in FIG. 7, next, the core material 127 shown in FIG. 6 is exposed and developed to form the core portion 82 and the connecting portion forming frames 93 and 94 having the through holes 93A and 94A. The thickness M2 of the core portion 82 and the thicknesses M4 and M5 of the connecting portion forming frames 93 and 94 can be set to be 80 μm, for example. Moreover, the diameters of the through holes 93A and 94A can be set to be 300 μm, for example.

Figure 8:
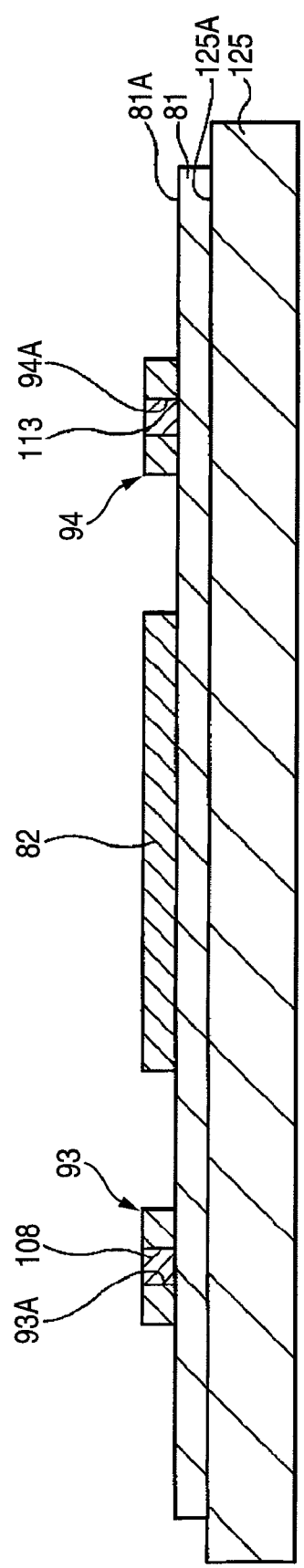
FIG. 8 is a view (No. 5) showing a step of manufacturing an optical/electrical hybrid substrate according to the first embodiment of the invention.

At a step shown in FIG. 8, then, a conductive material is filled in the through holes 93A and 94A and is thereafter subjected to a reflow treatment to form the first and second connecting portions 108 and 113. For the conductive material, it is possible to use Ag, for example.

At a step shown in FIG. 9, subsequently, the second clad layer 83 having the opening portions 104 and 105 is formed on the structure shown in FIG. 8. More specifically, a sheet-like clad layer is stuck onto the structure shown in FIG. 8 and is then exposed and developed to form the second clad layer 83. At this time, the opening portions 104 and 105 are formed in such a manner that diameters thereof are larger than those of the through holes 93A and 94A. In the case in which the diameters of the through holes 93A and 94A are 300 μm, the opening portions 104 and 105 can be set to have a diameter of 500 μm, for example.

Figure 9:
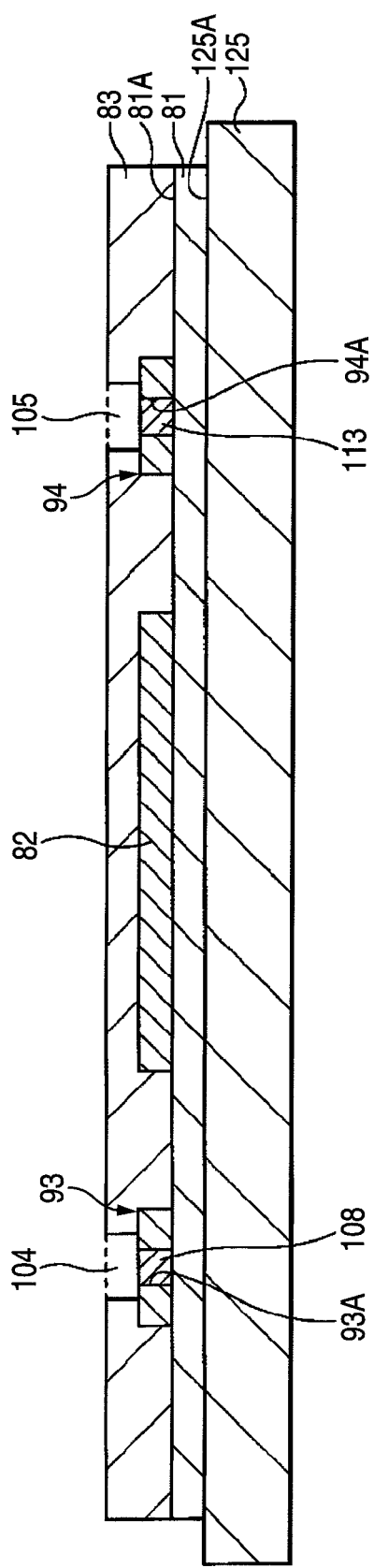
FIG. 9 is a view (No. 6) showing a step of manufacturing an optical/electrical hybrid substrate according to the first embodiment of the invention.
Figure 10:
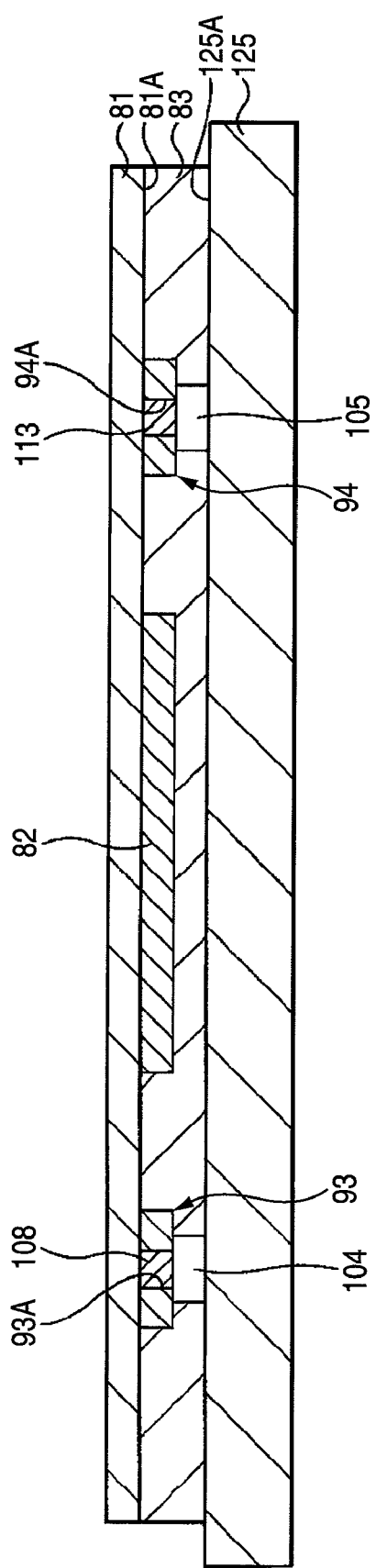
FIG. 10 is a view (No. 7) showing a step of manufacturing an optical/electrical hybrid substrate according to the first embodiment of the invention.

At a step shown in FIG. 10, next, the structure formed on the support substrate 125 shown in FIG. 9 is removed from the support substrate 125, and the structure removed from the support substrate 125 is then stuck to the support substrate 125 in such a manner that the second clad layer 83 comes in contact with the upper surface 125A of the support substrate 125.

Figure 11:
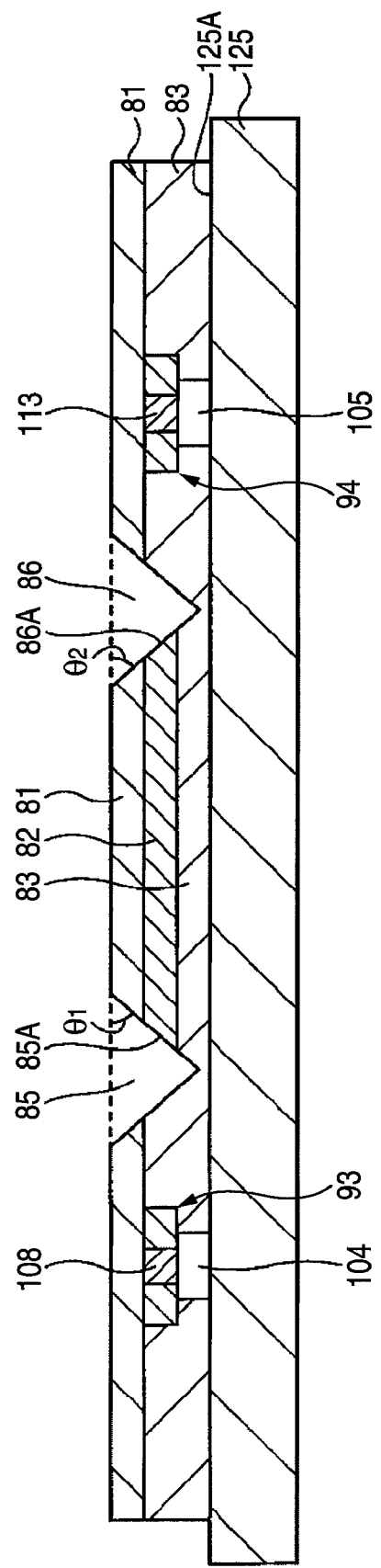
FIG. 11 is a view (No. 8) showing a step of manufacturing an optical/electrical hybrid substrate according to the first embodiment of the invention.

At a step shown in FIG. 11, thereafter, both ends of the core portion 82, and a part of the second clad layer 83 and the first clad layer 81 in portions positioned in the vicinity thereof are cut (by using a dicing blade, for example) to form the groove portion 85 for exposing one of the end faces of the core portion 82 and the groove portion 86 for exposing the other end face of the core portion 82. Consequently, the inclined surfaces 85A and 86A are formed on the first and second clad layers 81 and 83 and the core portion 82 in the exposed portions to the groove portions 85 and 86. Angles $\theta_1$ and $\theta_2$ of the inclined surfaces 85A and 86A can be set to be 45 degrees, for example.

Figure 12:
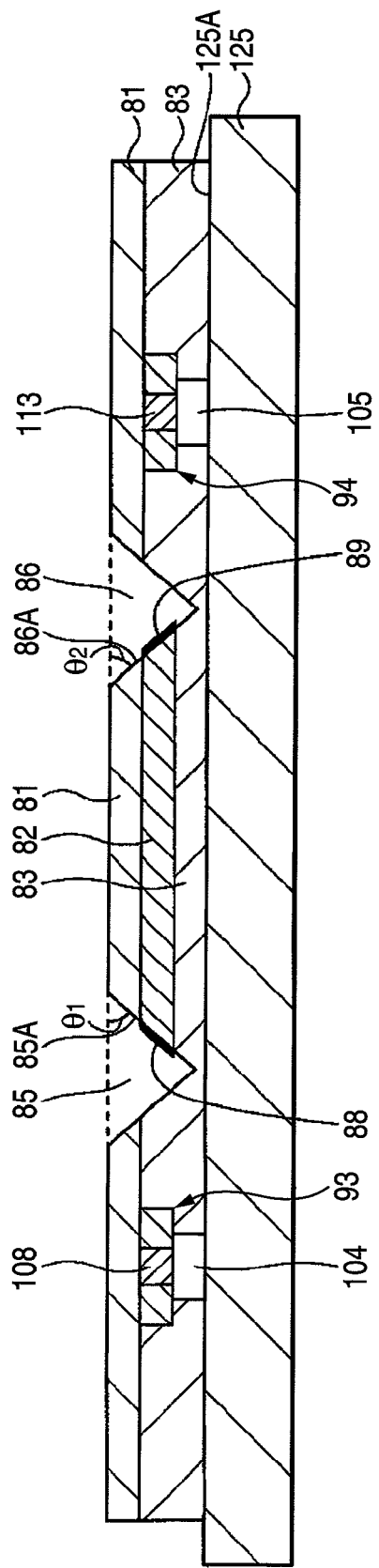
FIG. 12 is a view (No. 9) showing a step of manufacturing an optical/electrical hybrid substrate according to the first embodiment of the invention.

At a step shown in FIG. 12, next, the mirrors 88 and 89 are formed on the end faces of the core portion 82 which are exposed to the groove portions 85 and 86. More specifically, a metal film is formed on the end faces of the core portion 82 which are exposed to the groove portions 85 and 86 through a sputtering method using a mask, for example, so that the mirrors 88 and 89 are formed. For the metal film serving as the mirrors 88 and 89, it is possible to use an Au film, for example. In the case in which the Au film is used as the metal film, for example, a thickness of the Au film can be set to be 0.2 μm, for example.

Figure 13:
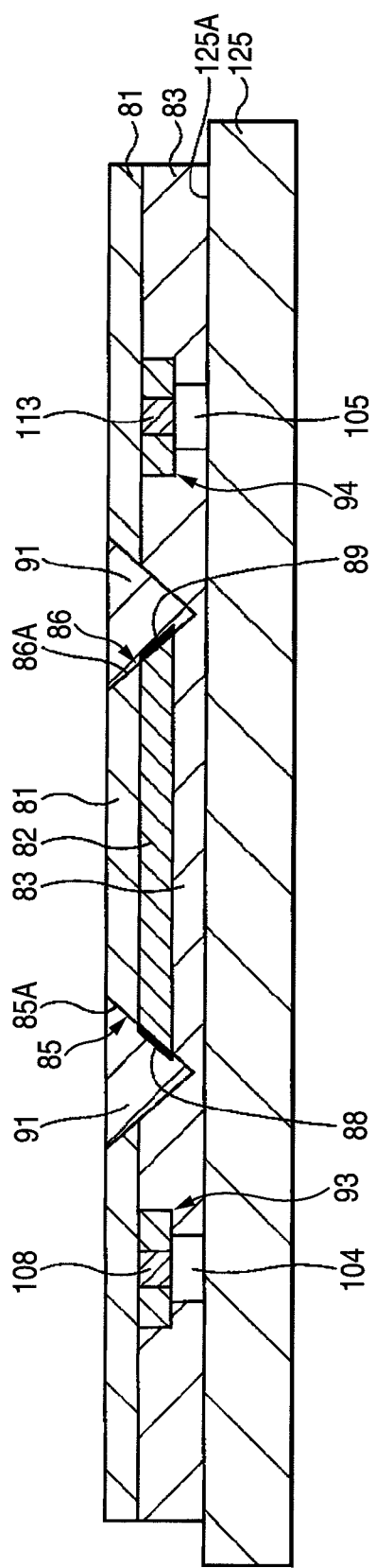
FIG. 13 is a view (No. 10) showing a step of manufacturing an optical/electrical hybrid substrate according to the first embodiment of the invention.

At a step shown in FIG. 13, subsequently, the groove portions 85 and 86 having the mirrors 88 and 89 formed thereon are filled with the clad material 91. Consequently, the mirrors 88 and 89 are sealed with the clad material 91.

Figure 14:
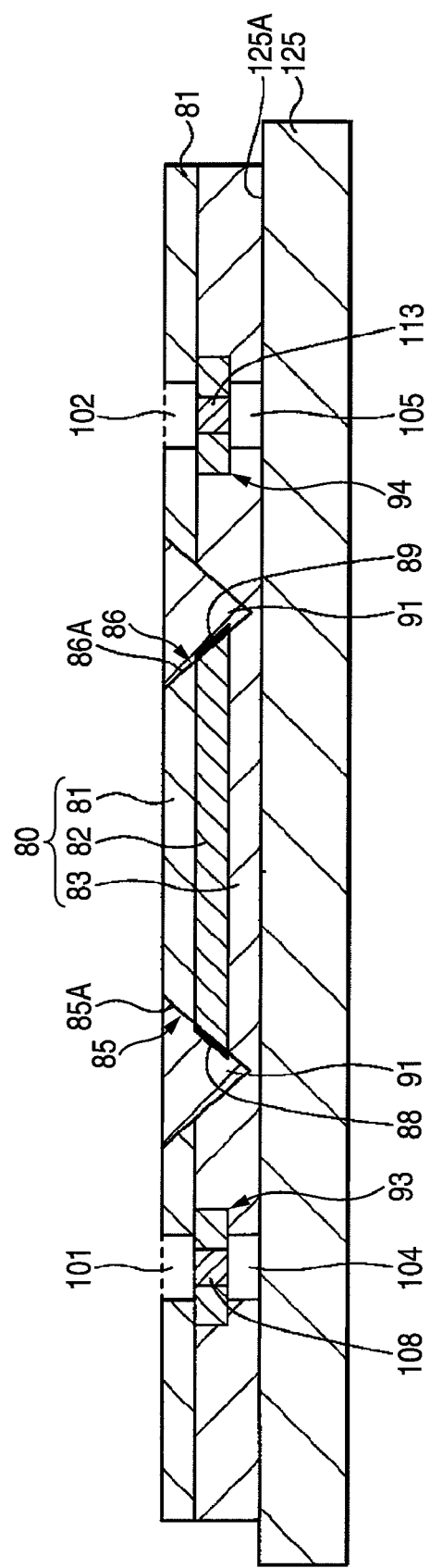
FIG. 14 is a view (No. 11) showing a step of manufacturing an optical/electrical hybrid substrate according to the first embodiment of the invention.
Figure 15:
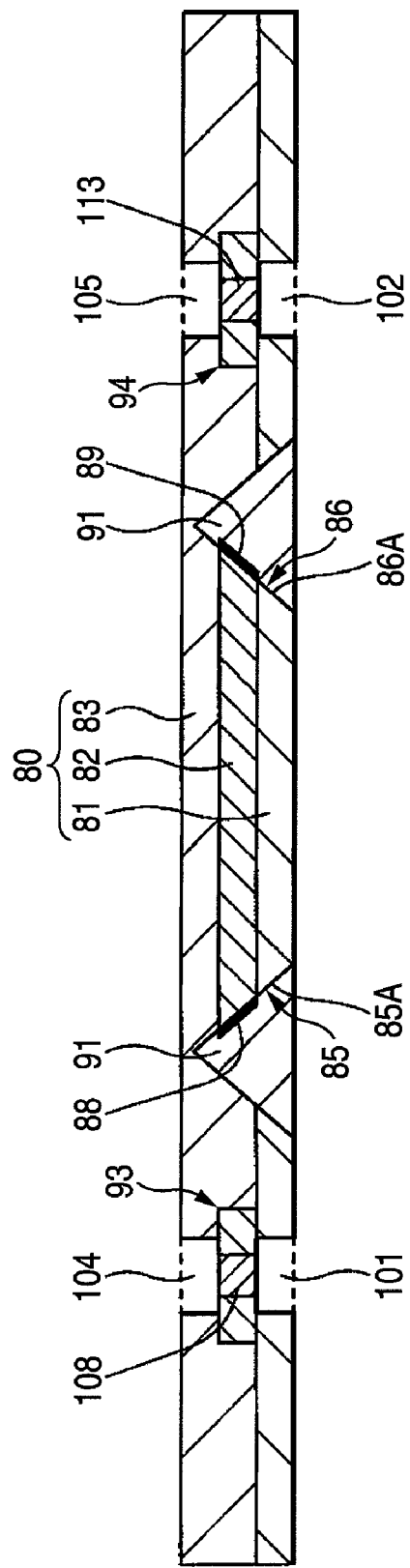
FIG. 15 is a view (No. 12) showing a step of manufacturing an optical/electrical hybrid substrate according to the first embodiment of the invention.
Figure 16:
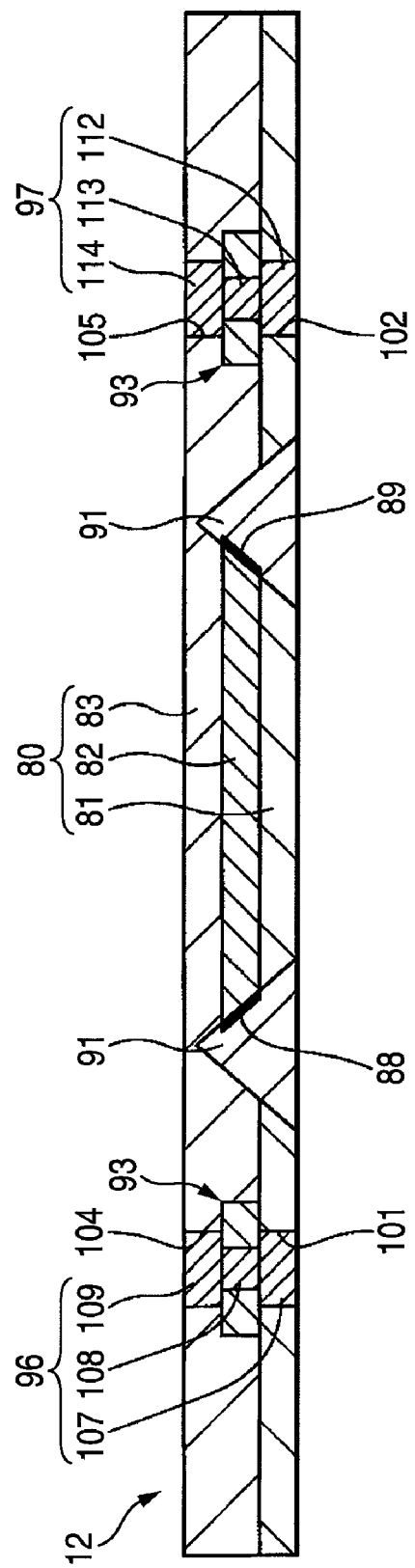
FIG. 16 is a view (No. 13) showing a step of manufacturing an optical/electrical hybrid substrate according to the first embodiment of the invention.

At a step shown in FIG. 14, then, the opening portion 101 for exposing the first connecting portion 108 and the opening portion 102 for exposing the second connecting portion 113 are formed on the first clad layer 81. More specifically, the opening portions 101 and 102 can be formed through end milling, for example. At this time, the opening portions 101 and 102 are formed in such a manner that diameters thereof are larger than those of the through holes 93A and 94A. In the case in which the diameters of the through holes 93A and 94A are 300 μm, the opening portions 101 and 102 can be set to have a diameter of 500 μm, for example.

At a step shown in FIG. 15, next, the support substrate 125 is removed from the structure shown in FIG. 14. At a step shown in FIG. 16, thereafter, a metal film is formed in the opening portions 101, 102, 104 and 105 so that the first and second vias 107 and 112 and the first and second pads 109 and 114 are formed. More specifically, for example, a metal film (for example, a Cu film) is deposited and grown to form the first and second vias 107 and 112 and the first and second pads 109 and 114 through an electrolytic plating method using the first and second connecting portions 108 and 113 as feeding layers. Consequently, the optical waveguide 12 is manufactured.

Figure 17:
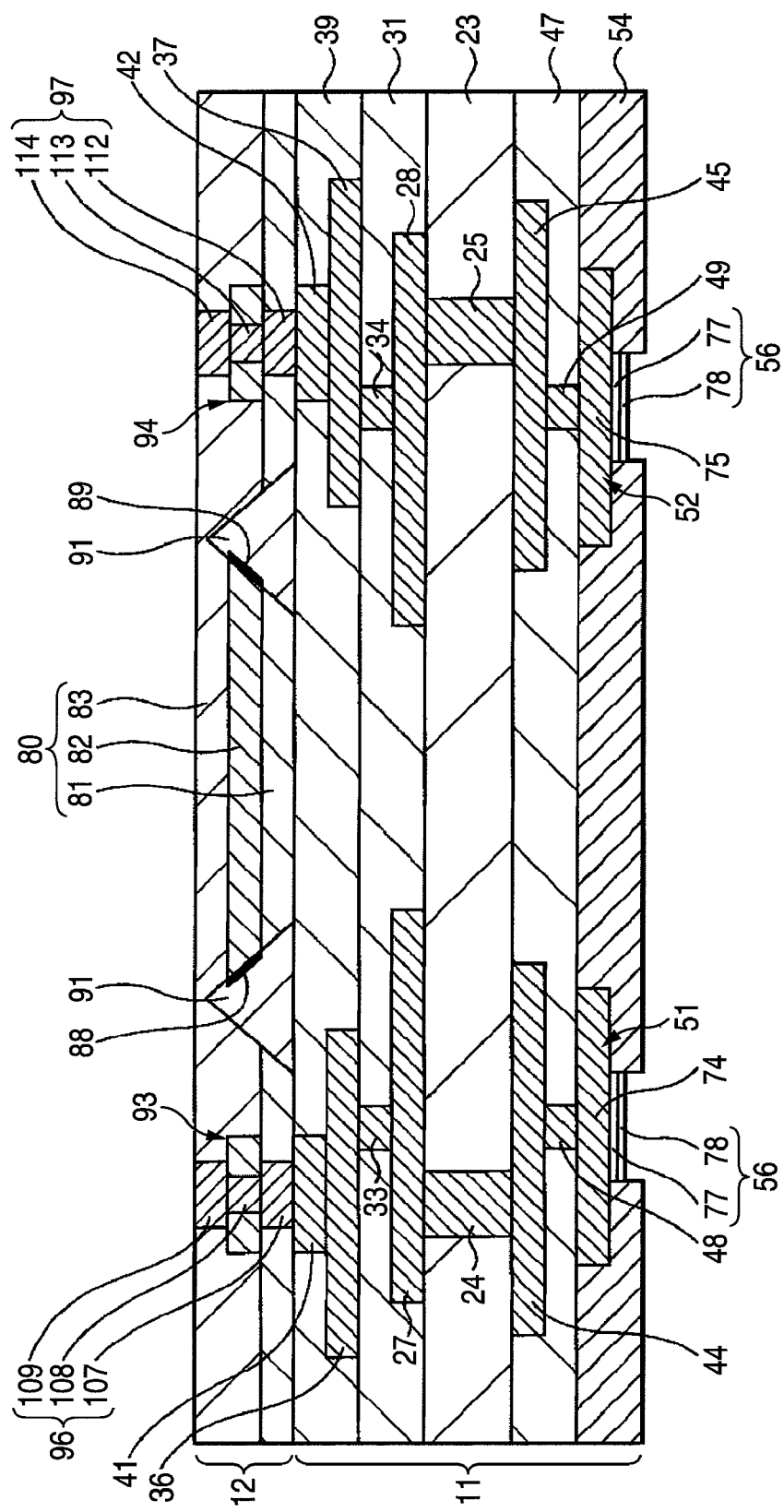
FIG. 17 is a view (No. 14) showing a step of manufacturing an optical/electrical hybrid substrate according to the first embodiment of the invention.
Figure 18:
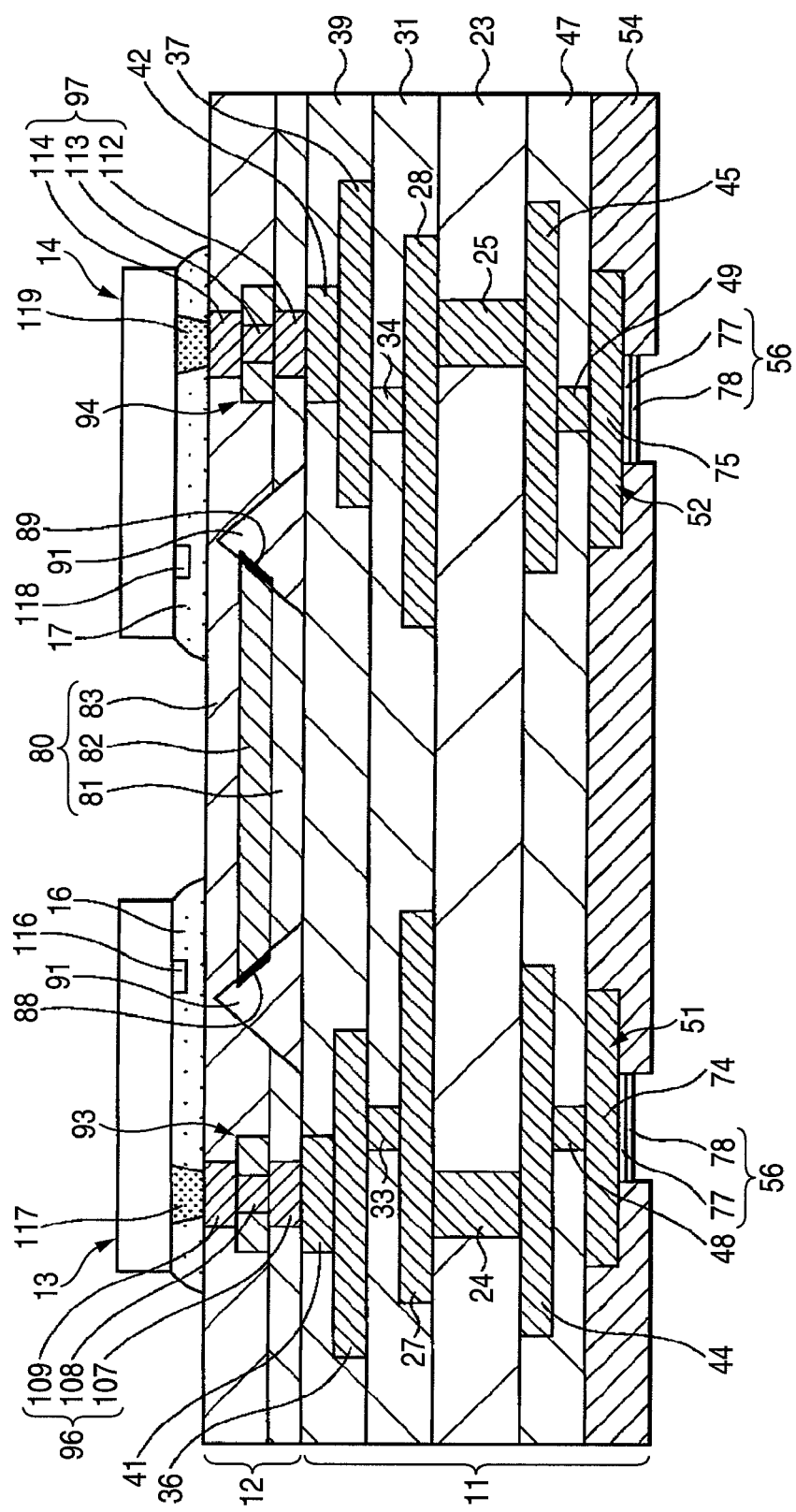
FIG. 18 is a view (No. 15) showing a step of manufacturing an optical/electrical hybrid substrate according to the first embodiment of the invention.

At a step shown in FIG. 17, thereafter, the optical waveguide 12 is bonded onto the wiring board 11 with a conductive adhesive (not shown). At a step shown in FIG. 18, next, the terminal 117 of the light emitting device 13 is fixed onto the first pad 109 through a solder (not shown), and furthermore, the underfill resin 16 is formed to fill a clearance between the light emitting device 13 and the optical waveguide 12. Subsequently, the terminal 119 of the light receiving device 14 is fixed onto the second pad 114 through a solder (not shown), and furthermore, the underfill resin 17 is formed to fill a clearance between the light receiving device 14 and the optical waveguide 12. For the underfill resins 16 and 17, it is possible to use a light transmitting resin, for example.

Figure 19:
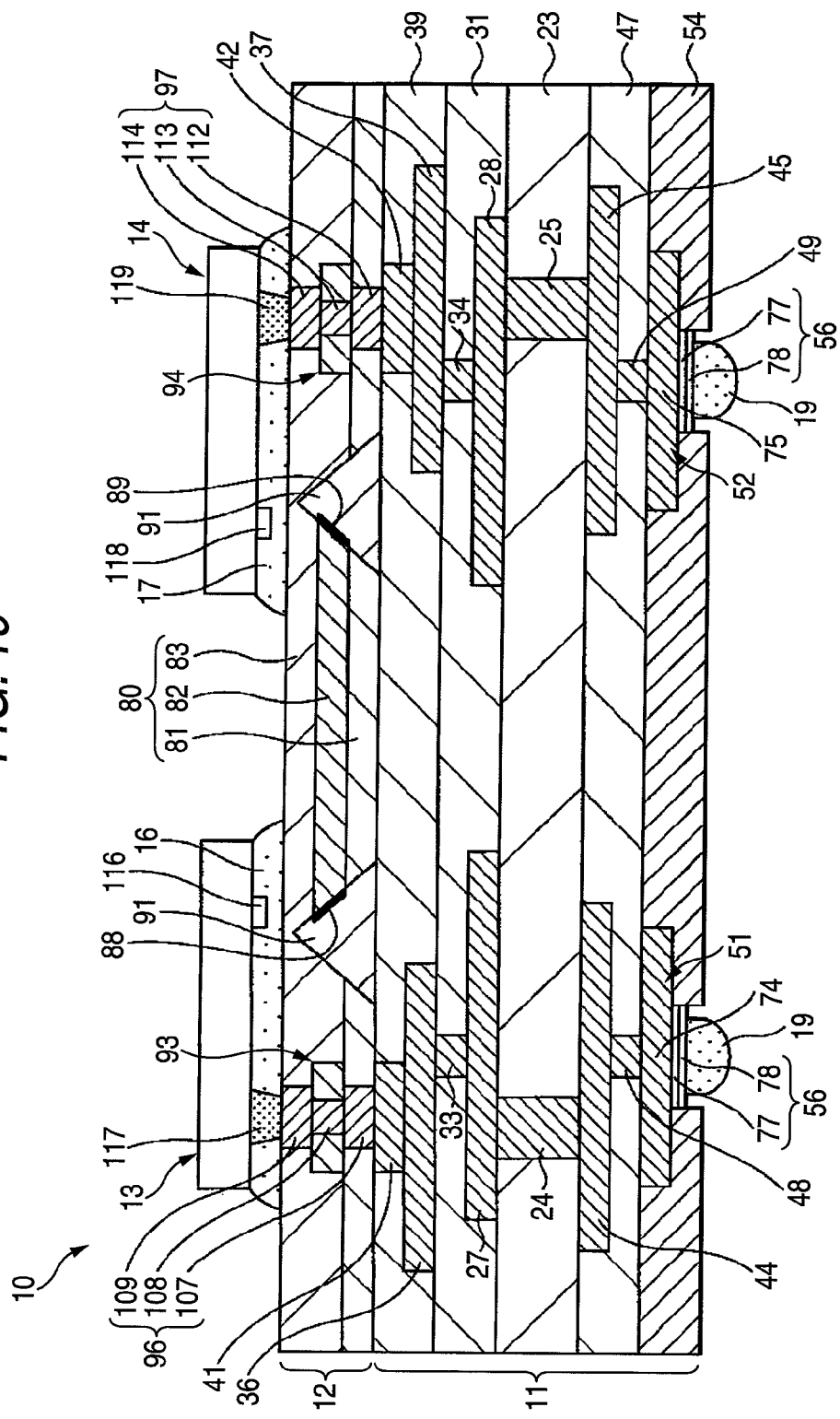
FIG. 19 is a view (No. 16) showing a step of manufacturing an optical/electrical hybrid substrate according to the first embodiment of the invention.

At a step shown in FIG. 19, subsequently, the external connecting terminal 19 is formed on the lower surface side of the diffusion preventing film 56. Consequently, there is manufactured the optical/electrical hybrid substrate 10 according to the first embodiment.

Second Embodiment

Figure 20:
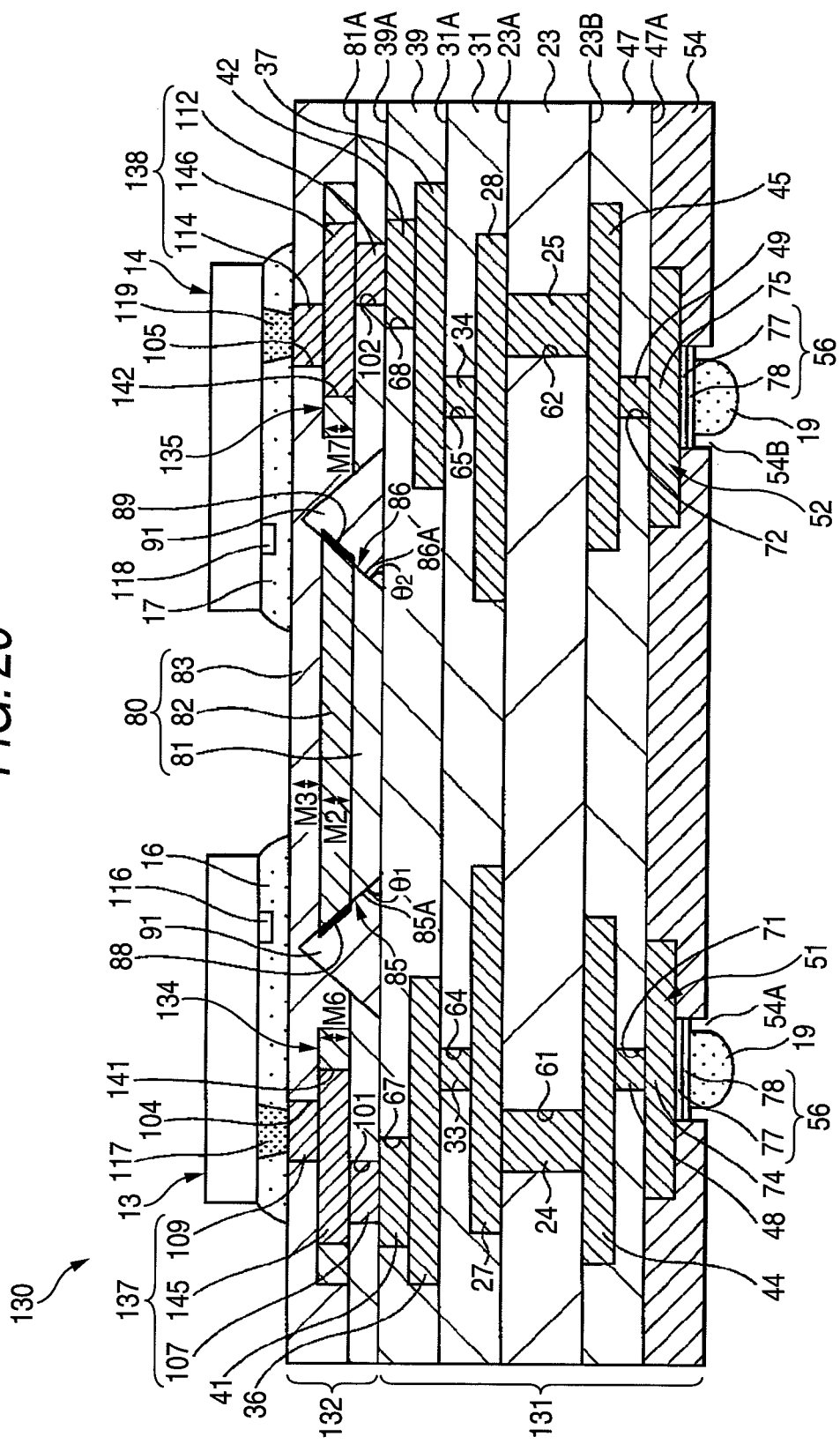
FIG. 20 is a sectional view showing an optical/electrical hybrid substrate according to a second embodiment of the invention.

FIG. 20 is a sectional view showing an optical/electrical hybrid substrate according to a second embodiment of the invention. In FIG. 20, the same components as those in the optical/electrical hybrid substrate 10 according to the first embodiment have the same reference numerals.

With reference to FIG. 20, an optical/electrical hybrid substrate 130 according to the second embodiment has the same structure as the structure of the optical/electrical hybrid substrate 10 except that a wiring board 131 and an optical waveguide 132 are provided in place of the wiring board 11 and the optical waveguide 12 which are provided in the optical/electrical hybrid substrate 10 according to the first embodiment.

The wiring board 131 has the same structure as the structure of the wiring board 11 except that the via 41 for an internal connecting terminal which is provided in the wiring board 11 described in the first embodiment is disposed on a wiring 36 in a portion positioned in the vicinity of an outer periphery of the optical/electrical hybrid substrate 130 and the via 42 for an internal connecting terminal which is provided in the wiring board 11 is disposed on a wiring 37 in a portion positioned in the vicinity of the outer periphery of the optical/electrical hybrid substrate 130.

The optical waveguide 132 has the same structure as the structure of the optical waveguide 12 except that wiring forming frames 134 and 135 and first and second wiring patterns 137 and 138 are provided in place of the connecting portion forming frames 93 and 94 and the first and second wiring patterns 96 and 97 which are provided in the optical waveguide 12 described in the first embodiment.

Figure 21:
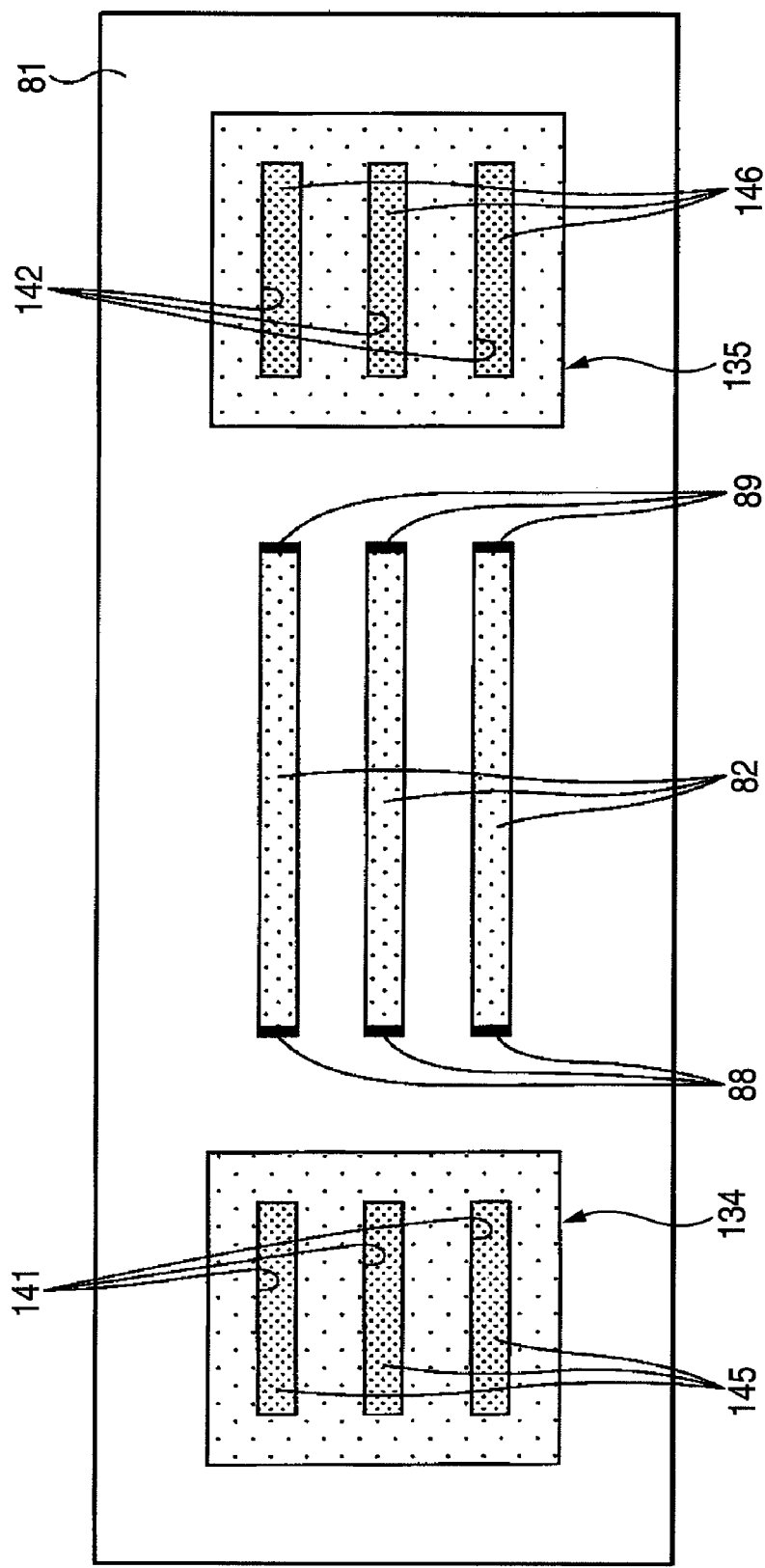
FIG. 21 is a view for explaining a core portion and a wiring forming frame illustrated in FIG. 20.

FIG. 21 is a view for explaining a core portion and the wiring forming frame illustrated in FIG. 20.

With reference to FIGS. 20 and 21, the wiring forming frame 134 is provided on a first clad layer 81 in a corresponding portion to a position in which an opening portion 101 is formed. The wiring forming frame 134 has a plurality of through grooves 141. The wiring forming frame 134 is constituted by a core material to be used for forming a core portion 82. Moreover, the wiring forming frame 134 is constituted in such a manner that a thickness M6 is almost equal to a thickness M2 of the core portion 82.

The wiring forming frame 135 is provided on the first clad layer 81 in a corresponding portion to a position in which an opening portion 102 is formed. The wiring forming frame 135 has a plurality of through grooves 142. The wiring forming frame 135 is constituted by the core material to be used for forming the core portion 82. Moreover, the wiring forming frame 135 is constituted in such a manner that a thickness M7 is almost equal to the thickness M2 of the core portion 82.

Namely, although there is a relation of M2≈M6≈M7, it is not necessarily to satisfy a relation of M1≈M3.

The first wiring pattern 137 has the same structure as the structure of the first wiring pattern 96 except that a first wiring 145 is provided in place of the first connecting portion 108 provided in the first wiring pattern 96 described in the first embodiment and the positions of the first via 107 and first pad 109 provided in the first wiring pattern 96 are shifted in a planar direction of the first clad layer 81 and a second clad layer 83.

Namely, a center of the first via may be shifted with respect to a center of the first connecting portion, and a center of the second via may be shifted with respect to a center of the second connecting portion.

The first wiring 145 is provided in the through groove 141 of the wiring forming frame 134. The first wiring 145 is provided on the upper surface 81A of the first clad layer 81 and an upper surface of the first via 107 which is on almost the level with the upper surface 81A of the first clad layer 81. In other words, the first wiring 145 is provided on the level with a surface on which the core portion 82 is disposed. The first wiring 145 is connected to an upper end of the first via 107 and a lower end of the first pad 109. A thickness of the first wiring 145 is almost equal to the thickness M2 of the core portion 82. For a material of the first wiring 145, it is possible to use Ag, for example.

Thus, the thickness of the first wiring 145 is set to be almost equal to the thickness M2 of the core portion 82, and furthermore, the first wiring 145 is disposed on the level with the surface on which the core portion 82 is provided. Consequently, it is possible to prevent the thickness of an optical waveguide body 80 from being greater than that of the optical waveguide 202 provided in the conventional optical/electrical hybrid substrate 200 (see FIG. 1).

Moreover, there is provided the first wiring 145 connected to the upper end of the first via 107 and connected to the lower end of the first pad 109. Consequently, it is possible to dispose the first via 107 and the first pad 109 in desirable positions.

The second wiring pattern 138 has the same structure as the structure of the second wiring pattern 97 except that a second wiring 146 is provided in place of the second connecting portion 113 provided in the second wiring pattern 97 described in the first embodiment and the positions of the second via 112 and second pad 114 provided in the second wiring pattern 97 are shifted in the planar direction of the first and second clad layers 81 and 83.

The second wiring 146 is provided in the through groove 142 of the wire forming frame 135. The second wiring 146 is provided on the upper surface 81A of the first clad layer 81 and an upper surface of a second via 112 which is on almost the level with the upper surface 81A of the first clad layer 81. In other words, the second wiring 146 is provided on the level with the plane on which the core portion 82 is disposed. The second wiring 146 is connected to an upper end of the second via 112 and a lower end of a second pad 114. The thickness of the second wiring 146 is almost equal to the thickness M2 of the core portion 82. For a material of the second wiring 146, it is possible to use Ag, for example.

Thus, the thickness of the second wiring 146 is set to be almost equal to the thickness M2 of the core portion 82, and furthermore, the second wiring 146 is disposed on the level with the surface on which the core portion 82 is provided. Consequently, it is possible to prevent the thickness of the optical waveguide body 80 from being greater than that of the optical waveguide 202 provided in the conventional optical/electrical hybrid substrate 200 (see FIG. 1).

Moreover, there is provided the second wiring 146 which is connected to the upper end of the second via 112 and the lower end of the second pad 114. Consequently, it is possible to dispose the second via 112 and the second pad 114 in desirable positions.

The optical/electrical hybrid substrate 130 having the structure can be manufactured by using the same technique as the method of manufacturing the optical/electrical hybrid substrate 10 according to the first embodiment described above.

According to the optical/electrical hybrid substrate in accordance with the embodiment, there are provided the first wiring 145 connected to the first via 107 and the first pad 109 and the second wiring 146 connected to the second via 112 and the second pad 114. Consequently, the first and second vias 107 and 112 and the first and second pads 109 and 114 can be disposed in desirable positions.

Moreover, the optical/electrical hybrid substrate 130 according to the embodiment can obtain the same advantages as those of the optical/electrical hybrid substrate 10 according to the first embodiment.

While the preferred embodiments according to the invention have been described above in detail, the invention is not restricted to the specific embodiments but various modifications and changes can be made without departing from the scope of the invention described in the claims.

INDUSTRIAL APPLICABILITY

The invention can be applied to an optical/electrical hybrid substrate comprising an optical waveguide provided on a wiring board and serving to transmit a light signal between a light emitting device and a light receiving device.

What is claimed is:

1. An optical/electrical hybrid substrate comprising:
a wiring board having wirings and vias disposed in the wiring board;
an optical waveguide including an optical waveguide body having a first clad layer, a second clad layer and a core portion disposed between the first clad layer and the second clad layer and provided on the wiring board, and a pair of mirrors for reflecting a light signal;
a first wiring pattern for electrically connecting a terminal of a light emitting device for irradiating the light signal to a wiring and via in the wiring board; and a second wiring pattern for electrically connecting a terminal of a light receiving device for receiving the light signal to another wiring and via disposed in the wiring board, wherein the first and second wiring patterns are disposed in the optical waveguide body, the first wiring pattern has a first pad provided in the second clad layer and connected to the terminal of the light emitting device, a first via provided in the first clad layer, and a first connecting portion for electrically connecting the first pad to the first via, the second wiring pattern has a second pad provided in the second clad layer and connected to the terminal of the light receiving device, a second via provided in the first clad layer, and a second connecting portion for electrically connecting the second pad to the second via, and thicknesses of the first and second connecting portions are set to be almost equal to a thickness of the core portion, and the first and second connecting portions are disposed on a level that is even with a surface on which the core portion is provided.

2. An optical/electrical hybrid substrate comprising:

a wiring board having wirings and vias disposed in the wiring board;

an optical waveguide including an optical waveguide body having a first clad layer, a second clad layer and a core portion disposed between the first clad layer and the second clad layer and provided on the wiring board, and a pair of mirrors for reflecting a light signal;

a first wiring pattern for electrically connecting a terminal of a light emitting device for irradiating the light signal to a wiring and via in the wiring board; and a second wiring pattern for electrically connecting a terminal of a light receiving device for receiving the light signal to another wiring and via disposed in the wiring board, wherein the first and second wiring patterns are disposed in the optical waveguide body, the first wiring pattern has a first pad provided in the second clad layer and connected to the terminal of the light emitting device, a first via provided in the first clad layer, and a first wiring for electrically connecting the first pad to the first via, the second wiring pattern has a second pad provided in the second clad layer and connected to the terminal of the light receiving device, a second via provided in the first clad layer, and a second wiring for electrically connecting the second pad to the second via, and thicknesses of the first and second wirings are set to be almost equal to a thickness of the core portion, and the first and second wirings are disposed on a level that is even with a surface on which the core portion is provided.

3. The optical/electrical hybrid substrate according to claim 1, wherein a center of the first via is shifted with respect to a center of the first connecting portion, and a center of the second via is shifted with respect to a center of the second connecting portion.

* * * * *